US012787614B2

(12) United States Patent
Yu et al.

(10) Patent No.: US 12,787,614 B2
(45) Date of Patent: Nov. 3, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Shengrong Yu, Wuhan (CN); Yuan Yan, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 294 days.

(21) Appl. No.: 18/566,118

(22) PCT Filed: Nov. 7, 2023

(86) PCT No.: PCT/CN2023/130100

§ 371 (c)(1),
(2) Date: Dec. 1, 2023

(87) PCT Pub. No.: WO2025/000808

PCT Pub. Date: Jan. 2, 2025

(65) Prior Publication Data

US 2025/0107413 A1 Mar. 27, 2025

(30) Foreign Application Priority Data

Jun. 30, 2023 (CN) ........................ 202310804380.3

(51) Int. Cl.
*H10K 59/80* (2023.01)
*G06V 40/13* (2022.01)
(Continued)

(52) U.S. Cl.
CPC ....... *H10K 59/879* (2023.02); *G06V 40/1318* (2022.01); *H10K 39/34* (2023.02); *H10K 59/122* (2023.02); *H10K 59/40* (2023.02)

(58) Field of Classification Search
CPC .... H10K 59/879; H10K 59/122; H10K 59/40; H10K 39/34; G06V 40/1318
See application file for complete search history.

(56) References Cited

U.S. PATENT DOCUMENTS

2017/0017824 A1 1/2017 Smith et al.
2022/0149335 A1* 5/2022 Hai .................... G06V 40/1318
(Continued)

FOREIGN PATENT DOCUMENTS

CN 109685003 A 4/2019
CN 111599846 A 8/2020
(Continued)

OTHER PUBLICATIONS

International Search Report in International application No. PCT/CN2023/130100, mailed on Dec. 20, 2023.
(Continued)

*Primary Examiner* — Peniel M Gumedzoe
(74) *Attorney, Agent, or Firm* — PV IP PC; Christopher S. Ruprecht; Wei Te Chung

(57) ABSTRACT

A display panel and a display device are provided. The display panel includes: a photosensitive layer including a photosensitive element; a first collimation layer including a first opening; an encapsulation layer; and a second collimation layer including a second opening. The first opening, the second opening, and the photosensitive element overlap with each other in a thickness direction of the photosensitive layer. The display panel also includes a first organic layer, and the encapsulation layer further includes a second organic layer. The first organic layer and the second organic layer are overlapped with the first opening, the second opening, and the photosensitive element in the thickness direction of the photosensitive layer.

16 Claims, 3 Drawing Sheets

(51) Int. Cl.

| | |
|---|---|
| ***H10K 39/34*** | (2026.01) |
| ***H10K 59/122*** | (2023.01) |
| *H10K 59/40* | (2023.01) |

(56) References Cited

U.S. PATENT DOCUMENTS

| | | | | |
|---|---|---|---|---|
| 2022/0399421 A1 | 12/2022 | Hai | | |
| 2023/0112427 A1* | 4/2023 | Yoo | ........................ | H10K 59/38 257/40 |
| 2023/0142687 A1* | 5/2023 | Ren | ........................ | H10K 59/60 257/40 |
| 2023/0329018 A1* | 10/2023 | Lee | ........................ | H10K 39/34 |

FOREIGN PATENT DOCUMENTS

| | | | |
|---|---|---|---|
| CN | 211427367 | U | 9/2020 |
| CN | 112001337 | A | 11/2020 |
| CN | 114267701 | A | 4/2022 |
| CN | 115241265 | A | 10/2022 |
| CN | 115955887 | A | 4/2023 |
| WO | 2018145461 | A1 | 8/2018 |
| WO | 2019200539 | A1 | 10/2019 |

OTHER PUBLICATIONS

Written Opinion of the International Search Authority in International application No. PCT/CN2023/130100, mailed on Dec. 20, 2023.

Chinese Office Action issued in corresponding Chinese Patent Application No. 202310804380.3 dated Aug. 27, 2026, pp. 1-8.

* cited by examiner

DISPLAY PANEL AND DISPLAY DEVICE

This application claims the benefit of priority to the Chinese patent application NO. 202310804380.3, filed with the China Patent Office on Jun. 30, 2023, with the application and the invention titled "Display Panel and Display Device", the disclosure of which is incorporated herein by reference in its entirety.

TECHNICAL FIELD

The present disclosure relates to a field of display technologies and in particular, to a display panel and a display device.

DESCRIPTION OF RELATED ART

In the related technologies, to improve the accuracy of fingerprint recognition and prevent valley signal crosstalk, a collimated optical path is formed inside a panel. This involves using Polarizer Layer Replacement technology (PLP, which uses color resistors R/G/B and a black matrix instead of polarizers) in which the black matrix (BM) and the black pixel definition layer (BPDL) create a collimated optical path. This process "converges" specific light reflected by a fingerprint onto the fingerprint recognition area, thereby enhancing optical recognition accuracy. However, in these related technologies, the small aperture of collimation holes leads to a smaller area of the fingerprint sensor, resulting in lower sensitivity.

TECHNICAL PROBLEM

This application provides a display panel and a display device designed to address the issue found in related technologies, where the small aperture of collimation holes leads to a reduced area of the fingerprint sensor and consequently lower sensitivity.

SOLUTION TO PROBLEM

In a first aspect, one embodiment of the present application provides a display panel, including: a photosensitive layer including a photosensitive element; a first collimation layer disposed on the photosensitive element and including a first opening; an encapsulation layer disposed on the first collimation layer; and a second collimation layer disposed on the encapsulation layer and including a second opening, wherein the first opening, the second opening, and the photosensitive element overlap each other in a thickness direction of the photosensitive layer, wherein the display panel further includes a first organic layer disposed between the encapsulation layer and the second collimation layer; the encapsulation layer further includes a second organic layer; the first organic layer and the second organic layer overlap with the first opening, the second opening, the photosensitive element in the thickness direction of the photosensitive layer.

In one embodiment, the first collimation layer is a pixel definition layer, the pixel definition layer is provided with a plurality of pixel openings and multiple first openings, a light-emitting device is disposed in each of the pixel openings, and the pixel definition layer includes a black organic material.

In one embodiment, the second collimation layer is a color filter layer, the color filter layer includes a plurality of color resistors and a black matrix, and the black matrix further includes a plurality of color resistor openings and multiple second openings, and the color resistors are disposed in the color resistor openings.

In one embodiment, an aperture of the first opening is larger than an aperture of the second opening.

In one embodiment, an aperture of the first opening is smaller than an aperture of the second opening.

In one embodiment, the display panel further includes a touch layer disposed between the encapsulation layer and the first organic layer, wherein the touch layer includes a plurality of touch signal lines, a third opening is defined between at least two adjacent touch signal lines, and the third opening overlaps with the first opening and the second opening in the thickness direction of the photosensitive layer.

In one embodiment, the display panel further includes a first planarization layer, the first planarization layer including a planarization portion and a first barrier;

- wherein the planarization portion is disposed between the touch layer and the first organic layer, and the first barrier is disposed on the pixel definition layer and arranged outside the first organic layer.

In one embodiment, a portion of the planarization portion is filled in the third opening.

In one embodiment, the encapsulation layer includes a first inorganic layer and a second inorganic layer, and the first inorganic layer, the second organic layer and the second inorganic layer overlap each other in the thickness direction of the photosensitive layer, wherein the display panel further includes a plurality of second barriers, the second barriers are disposed on the first inorganic layer, the second barriers are disposed outside the second organic layer, an orthographic projection of each of the second barriers projected on the pixel definition layer is located outside an orthographic projection of the first barrier projected on the first collimation layer.

In a second aspect, one embodiment of the present application further provides a display device, including a display panel, wherein the display panel includes:

- a photosensitive layer including a photosensitive element;
- a first collimation layer disposed on the photosensitive element and including a first opening;
- an encapsulation layer disposed on the first collimation layer; and
- a second collimation layer disposed on the encapsulation layer and including a second opening, wherein the first opening, the second opening, and the photosensitive element overlap each other in a thickness direction of the photosensitive layer,
- wherein the display panel further includes a first organic layer disposed between the encapsulation layer and the second collimation layer; the encapsulation layer further includes a second organic layer; the first organic layer and the second organic layer overlap with the first opening, the second opening, the photosensitive element in the thickness direction of the photosensitive layer.

In one embodiment, the first collimation layer is a pixel definition layer, the pixel definition layer is provided with a plurality of pixel openings and multiple first openings, a light-emitting device is disposed in each of the pixel openings, and the pixel definition layer includes a black organic material.

In one embodiment, the second collimation layer is a color filter layer, the color filter layer includes a plurality of color resistors and a black matrix, and the black matrix further includes a plurality of color resistor openings and multiple second openings, and the color resistors are disposed in the color resistor openings.

In one embodiment, an aperture of the first opening is larger than an aperture of the second opening.

In one embodiment, an aperture of the first opening is smaller than an aperture of the second opening.

In one embodiment, the display panel further includes a touch layer disposed between the encapsulation layer and the first organic layer, wherein the touch layer includes a plurality of touch signal lines, a third opening is defined between at least two adjacent touch signal lines, and the third opening overlaps with the first opening and the second opening in the thickness direction of the photosensitive layer.

In one embodiment, the display panel further includes a first planarization layer, the first planarization layer including a planarization portion and a first barrier; wherein the planarization portion is disposed between the touch layer and the first organic layer, and the first barrier is disposed on the pixel definition layer and arranged outside the first organic layer.

In one embodiment, a portion of the planarization portion is filled in the third opening.

In one embodiment, the encapsulation layer includes a first inorganic layer and a second inorganic layer, and the first inorganic layer, the second organic layer and the second inorganic layer overlap each other in the thickness direction of the photosensitive layer, wherein the display panel further includes a plurality of second barriers, the second barriers are disposed on the first inorganic layer, the second barriers are disposed outside the second organic layer, an orthographic projection of each of the second barriers projected on the pixel definition layer is located outside an orthographic projection of the first barrier projected on the first collimation layer.

BENEFICIAL EFFECTS

Compared to existing technologies, the display panel and the display device provided in this application improve fingerprint recognition sensitivity by configuring a first organic layer on the touch layer and a second organic layer in the encapsulation layer. The first organic layer and the second organic layer jointly modulate a length of the collimator, thereby increasing a range of a collimating length of the collimator and consequently increasing a range of a collimating diameter of the collimator. This increase in collimating diameter allows for a larger area of the photosensitive element, enhancing fingerprint recognition sensitivity. This addresses the issue in related technologies where the small aperture of the collimation holes leads to a smaller area for the fingerprint sensor, resulting in lower sensitivity.

DETAILED DESCRIPTION OF EMBODIMENTS OF THE INVENTION

The present application provides a display panel and display device. To make the objectives, technical solutions, and effects of this application clearer and more precise, the following describes in further detail with reference to the accompanying drawings and specific embodiments. It should be understood that the specific embodiments described here are only used to explain this application and are not intended to limit this application.

To improve the accuracy of fingerprint recognition and prevent valley signal crosstalk, related technologies form a collimated optical path inside a panel, using a black matrix (BM) and a black pixel definition layer (BPDL) in a polarizer less panel (PLP, using color resistors R/G/B and a black matrix instead of polarizers) to form a collimated optical path. This "converges" the specific light reflected by a fingerprint 200 to a fingerprint recognition area, thus improving optical recognition accuracy. However, apertures of collimation holes in related technologies are too small, resulting in a small sensor area, and the small collimating diameter also makes the process difficult to implement.

Figure 1:
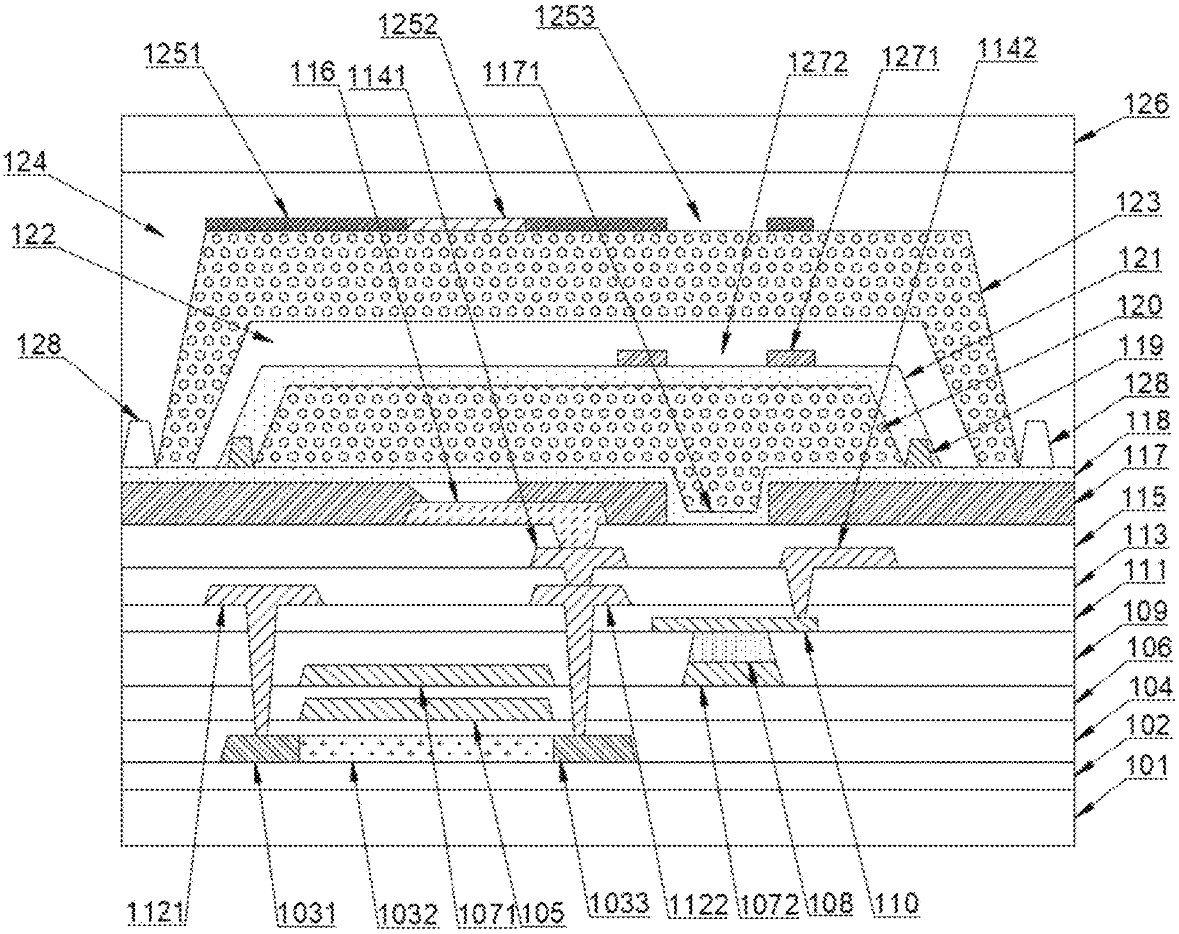
FIG. 1 is a schematic structural view of a display panel according to one embodiment of the present application.

As shown in FIG. 1, this embodiment provides a display panel, which includes a substrate 101, a buffer layer 102, semiconductor, a first gate insulating layer 104, a first gate 105, an interlayer insulating layer 109, a source electrode 1121, a drain electrode 1122, a third planarization layer 115, an anode 116, a pixel definition layer 117, an organic emission layer, a cathode, an encapsulation layer, a touch layer.

The substrate 101 can be made of an organic material, which is insulating and flexible, allowing for heat treatment at temperatures equal to or greater than about 450° C. The substrate 101 can be formed as a single layer of polyimide or multiple layers of polyimide formed by coating and curing repeatedly. The substrate 101 can be a flexible substrate formed by coating and curing polymeric material such as polyimide on a support substrate (not illustrated). In this case, the substrate 101 can be formed into multiple layers by repeatedly coating and curing the polymeric material. The support substrate can be formed from glass, metal, or ceramic, and polyimide can be coated on the support substrate using coating processes such as spin coating, slit coating, inkjet coating, etc. The support substrate can be removed in subsequent processes.

The buffer layer 102 can provide a planarization layer on an upper surface of the substrate 101 and can prevent or stop impurities and moisture from infiltrating from the substrate 101 into a display unit (i.e., an organic light-emitting device).

The semiconductor, formed on the buffer layer 102, is made of polycrystalline silicon. The semiconductor is divided into a channel region 1032, a source region 1031, and a drain region 1033. The source region 1031, and the drain region 1033 are formed on two sides of the channel region 1032. The channel region 1032 of the semiconductor is undoped polycrystalline silicon, i.e., intrinsic semiconductor. The source region 1031 and drain region 1033 are polycrystalline silicon doped with conductive impurities, i.e., impurity semiconductors. The impurities doped in the source region 1031 and the drain region 1033 can be either P-type or N-type.

The first gate insulating layer 104 is formed on the semiconductor. The first gate insulating layer 104 can be a single layer or multiple layers including at least one of tetraethyl orthosilicate (TEOS), silicon nitride, and silicon oxide.

The first gate 105 is formed on the first gate insulating layer 104, and the first gate 105 overlaps with the channel region 1032. The first gate 105 can be formed of a low-resistance material such as Al, Ti, Mo, Cu, Ni, or their alloys, or a material with high corrosion resistance, as a single layer or multiple layers.

The interlayer insulating layer 109 is formed on the first gate 105. A passivation layer 111 is formed on the interlayer insulating layer 109. The passivation layer 111, the interlayer insulating layer 109, and the first gate insulating layer 104 include a source contact hole and a drain contact hole, through which the source region 1031 and the drain region 1033 are respectively exposed.

The source electrode 1121 and the drain electrode 1122 are both formed on the passivation layer 111. The source electrode 1121 connects to the source region 1031 through the source contact hole, and the drain electrode 1122 connects to the drain region 1033 through the drain contact hole. The source electrode 1121 and the drain electrode 1122 can be formed from low-resistance materials such as Al, Ti, Mo, Cu, Ni, or their alloys, or from materials with high corrosion resistance in multiple layers or a single layer. For example, the source electrode 1121 and the drain electrode 1122 can be a triple layer of Ti/Cu/Ti, Ti/Ag/Ti, Ti/Al/Ti, or Mo/Al/Mo, and others.

Furthermore, the first gate 105, the source electrode 1121, and the drain electrode 1122 respectively serve as a control electrode, an input electrode, and an output electrode of a thin-film transistor in a driving circuit of the display panel and, together with the semiconductor, form the thin-film transistor. The channel of the thin-film transistor is between the source electrode 1121 and the drain electrode 1122.

The third planarization layer 115 and a fourth planarization layer 113 are formed. The fourth planarization layer 113 is formed on the source electrode 1121 and the drain electrode 1122. The third planarization layer 115 is formed on the fourth planarization layer 113. The third planarization layer 115 and the fourth planarization layer 113 include a via hole, exposing the drain electrode 1122. In some embodiments, the display panel also includes a first connecting portion 1141. The first connecting portion 1141 is arranged on the fourth planarization layer 113 and is electrically connected to the drain electrode 1122.

The anode 116 is formed on the third planarization layer 115. The anode 116 is electrically connected to the first connecting portion 1141 through the via hole.

The pixel definition layer 117 is formed on the anode 116. The pixel definition layer 117 has an anode opening through which the anode 116 is exposed. The pixel definition layer 117 can be formed from materials including resin, such as polyacrylate or polyimide, and organic materials such as silicates.

The organic emission layer (not illustrated) is formed in the opening of the pixel definition layer 117. The organic emission layer is composed of one or more emission layers, a hole injection layer (HIL), a hole transport layer (HTL), an electron transport layer (ETL), and an electron injection layer (EIL). In cases where the organic emission layer includes all the aforementioned layers, the hole injection layer (HIL) can be located on the anode 116, and the hole transport layer (HTL), the emission layer, the electron transport layer (ETL), and the electron injection layer (EIL) can be sequentially layered on the hole injection layer (HIL).

A cathode (not illustrated) is formed on the pixel definition layer 117 and the organic emission layer. The cathode serves as a cathode of an organic light-emitting diode. Thus, the anode 116, the organic emission layer, and the cathode form an organic light-emitting device. In the following embodiments, the cathode above a photosensitive element is provided with an opening corresponding to a first opening 1171 and a second opening 1253.

Depending on the direction of light emitted by the organic light-emitting device, the organic light-emitting diode display can have a top-emission type, a bottom-emission type, or a dual-emission type structure.

In the top-emission type, the anode 116 forms a reflective layer, and the cathode forms a semi-transparent layer or a transparent layer. On the other hand, in the bottom-emission type, the anode 116 forms a semi-transparent layer, and the cathode forms a reflective layer. Additionally, in the dual-emission type, the anode 116 and the cathode form either a transparent layer or a semi-transparent layer.

The reflective layer and the semi-transparent layer are made using metals such as magnesium (Mg), silver (Ag), gold (Au), calcium (Ca), lithium (Li), chromium (Cr), and aluminum (Al), or their alloys. The reflective layer and the semi-transparent layer are determined by their thickness. As the thickness decreases, the transmission rate increases, so the semi-transparent layer can be formed with a thickness of about 200 nm or less. The transparent layer is made from materials like indium tin oxide (ITO), indium zinc oxide (IZO), zinc oxide (ZnO), or indium oxide (In2O3).

The encapsulation layer is formed on the cathode. The encapsulation layer can be formed by alternating one or more organic layers with one or more inorganic layers. Each of the organic layer and the inorganic layer can be provided in multiples.

The organic layers are formed from polymers and can be a single layer or a laminate layer made from materials like polyethylene terephthalate, polyimide, polycarbonate, epoxy resin, polyethylene, and polyacrylate. The organic layer can be formed from polyacrylate, specifically including substances obtained by polymerizing a monomer composition including diacrylate-based and triacrylate-based monomers. The monomer composition may also include monoacrylate-based monomers. Additionally, the monomer composition may include well-known photoinitiators like TPO, but is not limited to these. The inorganic layer can be a single layer or a laminate layer including metal oxides or metal nitrides. For example, the inorganic layer can include any of $SiN_x$, $Al_2O_3$, $SiO_2$, and $TiO_2$.

An outermost layer of the encapsulation layer exposed to the exterior is formed from an inorganic layer to prevent moisture transmission into the interior of the organic light-emitting diode display. The encapsulation layer can include at least one interlayer structure, with at least one organic layer is inserted between at least two inorganic layers. Furthermore, the encapsulation layer can include at least one interlayer structure with at least one inorganic layer inserted between at least two organic layers.

The encapsulation layer can include a first inorganic layer 118, a second organic layer 120, and a second inorganic layer 121 sequentially disposed on the cathode. In some embodiments, the encapsulation layer can sequentially include the first inorganic layer 118, the second organic layer 120, the second inorganic layer 121, a third organic layer, and a third inorganic layer. In other embodiments, the encapsulation layer can include a first inorganic layer 118, a second organic layer 120, a second inorganic layer 121, a third organic layer, a third inorganic layer, a fourth organic layer, and a fourth inorganic layer. As shown in FIG. 1, in this embodiment, the second organic layer 120 is completely covered by the second inorganic layer 121, that is, the second inorganic layer 121 covers a surface of the second organic layer 120.

The above embodiments have demonstrated an embodiment of the display panel of this application. In subsequent embodiments, this application elaborates on technical concepts of this application based on the structure of the above embodiment. Therefore, features appearing in the above embodiment are not described again, and subsequent embodiments of this application can refer to the features in the above embodiment unless otherwise specified.

Figure 4:
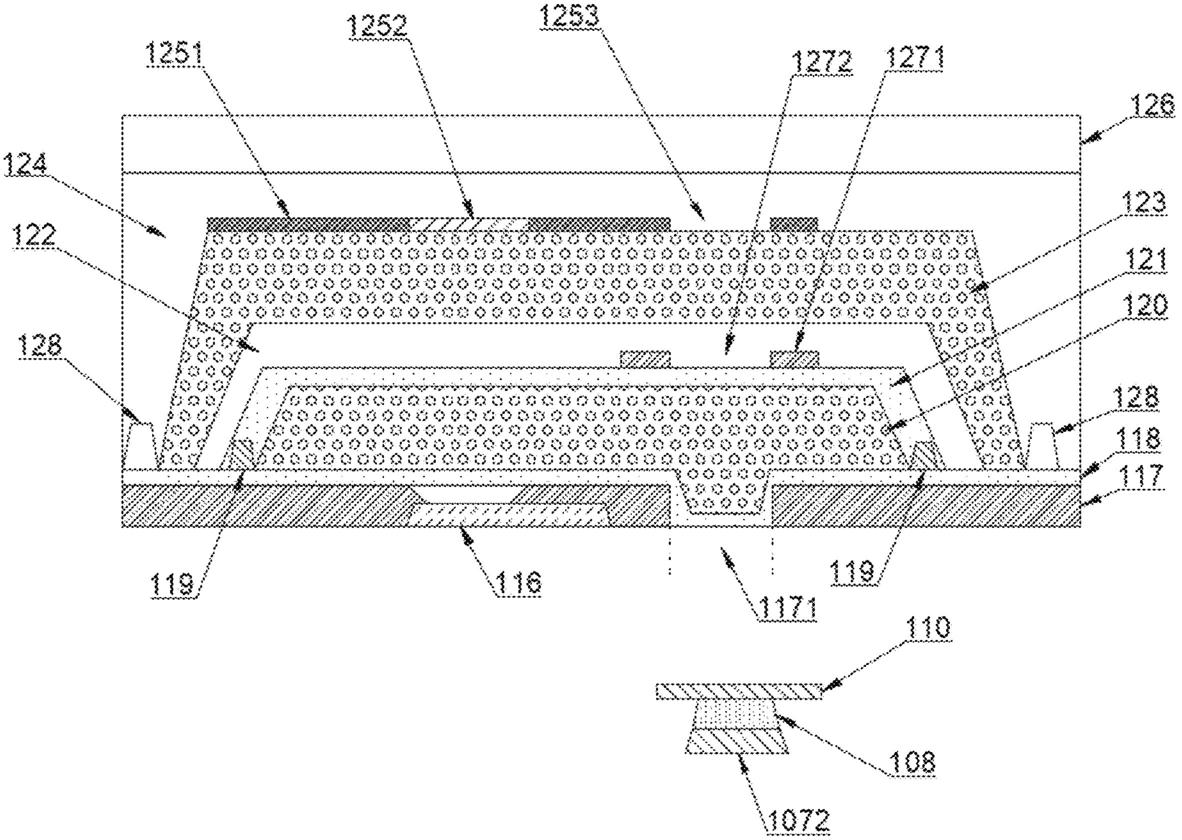
FIG. 4 is a schematic structural view of the display panel according to one embodiment of the present application.

As shown in FIG. 4, in one embodiment, the encapsulation layer includes the first inorganic layer 118, the second organic layer 120, and the second inorganic layer 121. The first inorganic layer 118, the second organic layer 120, and the second inorganic layer 121 overlap each other in a thickness direction of the photosensitive layer. The display panel further includes multiple second barriers 119 which are located on the first inorganic layer 118 and arranged on the outside of the second organic layer 120. The arrangement of the second barriers 119 prevents the second organic layer 120 from spilling out during formation.

In one embodiment, the photosensitive element includes a photodiode or a photosensitive transistor. The display panel also includes a second gate layer, a first electrode 110, and a PIN junction 108, a touch layer, a first organic layer 123, and a color filter layer. The second gate layer includes a second gate 1071 and a second electrode 1072. The PIN junction 108 is located on the second gate 1071, the interlayer insulating layer 109 is positioned on the second gate 1071 and the PIN junction 108, and the first electrode 110 is positioned on the interlayer insulating layer 109. The passivation layer 111 is located on the first electrode 110. Both the first electrode 110 and the second electrode 1072 are electrically connected to the PIN junction 108. The first electrode 110, the PIN junction 108, and the second electrode 1072 constitute the photosensitive element. Therefore, the photosensitive layer can include the second gate layer, the film layer where the PIN junction 108 is located, and the film layer where the first electrode 110 is located. In some embodiments, a second gate insulating layer 106 is set on the first gate 105, with the second gate layer located on the second gate insulating layer 106. In some embodiments, there is also a second connecting portion 1142 on the fourth planarization layer 113. The second connecting portion 1142 is used for electrical connection with the first electrode 110.

The pixel definition layer 117 also has the first opening 1171 which directly faces the photosensitive element. The pixel definition layer 117 acts as a first collimating layer and includes a black organic material. The first opening 1171 is used to constrain the light entering the photosensitive element.

The touch layer can be directly disposed on the encapsulation layer and includes multiple touch sensors (not illustrated) and multiple touch signal lines 1271. The touch sensors and touch signal lines 1271 can have a single-layer structure or a multi-layer structure. Each of the touch sensors and the touch signal lines 1271 can include materials such as indium tin oxide (ITO), indium zinc oxide (IZO), zinc oxide (ZnO), indium tin zinc oxide (ITZO), poly(3,4-ethylenedioxythiophene) (PEDOT), metal nanowires, and/or graphene. Each of the touch sensors and the touch signal lines 1271 can also include metal layers such as molybdenum, silver, titanium, copper, aluminum, and/or their alloys. The touch sensors and the touch signal lines can have the same single-layer structure or different layer structures from each other.

The first organic layer 123 is located on the touch layer, and a material of the first organic layer 123 can be the same as a material of the second organic layer 120. The color filter layer is located on the first organic layer 123 and includes color resistors 1252 and a black matrix 1251. The black matrix 1251 also has multiple color resistor openings and multiple second openings 1253, with the color resistors 1252 located within the color resistor openings. The second opening 1253 is used to constrain the light entering the first opening 1171, and in this embodiment, the color filter layer acts as a second collimating layer. The first opening 1171, the second opening 1253, and the photosensitive element overlap in the thickness direction of the photosensitive layer. The first organic layer 123 and the second organic layer 120 overlap with the first opening 1171, the second opening 1253, and the photosensitive element in the thickness direction of the photosensitive layer. Both the first organic layer 123 and the second organic layer 120 are formed using ink printing technology.

Figure 2:
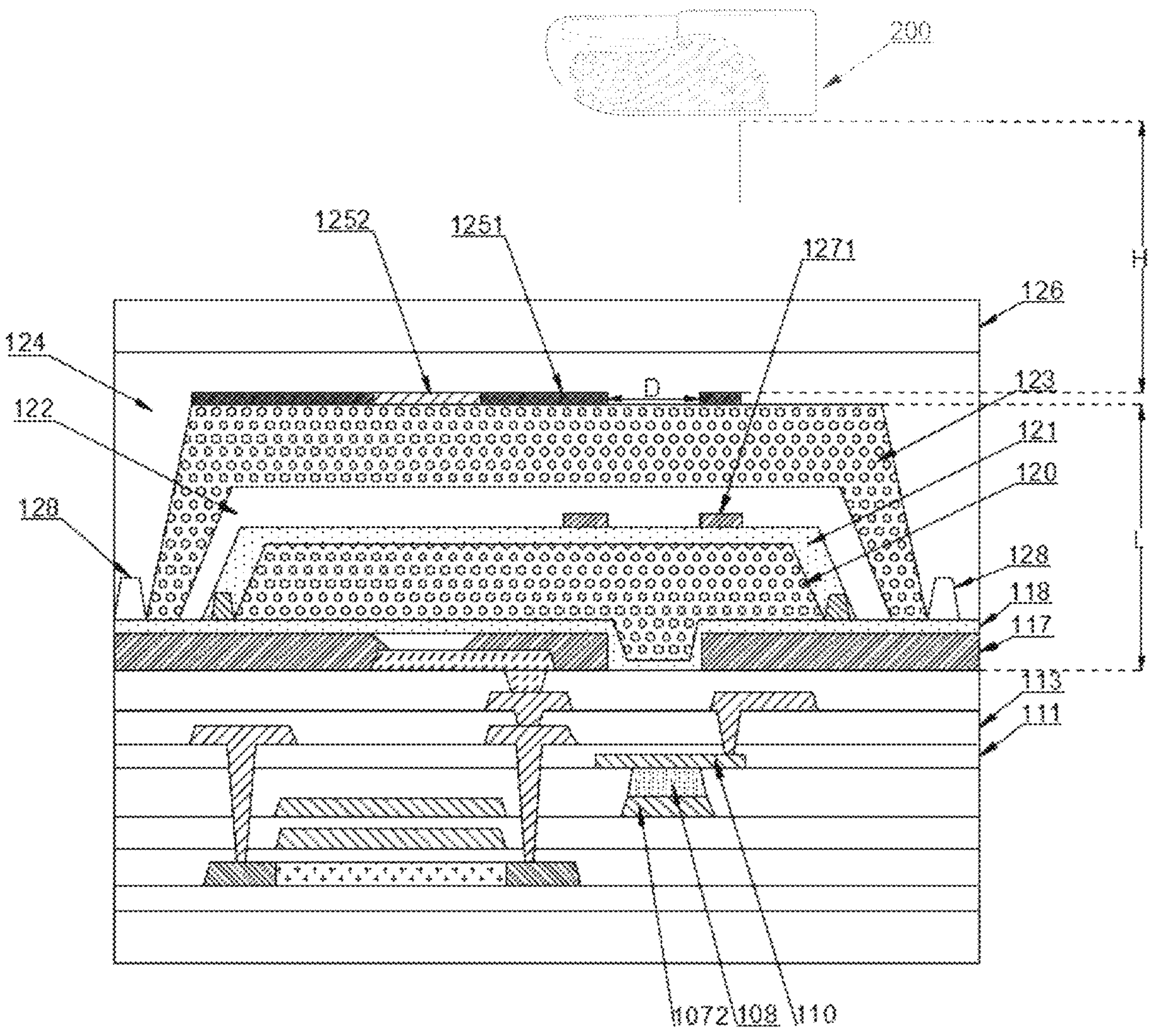
FIG. 2 is a schematic structural view of the display panel during fingerprint recognition according to one embodiment of the present application.
Figure 3:
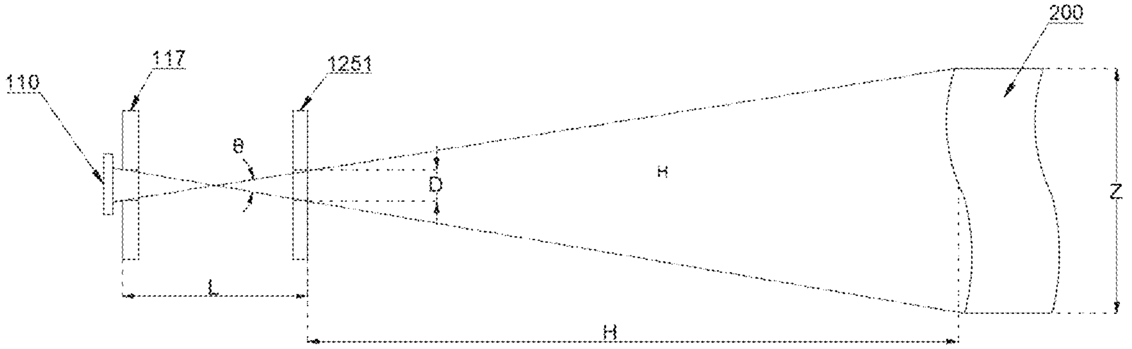
FIG. 3 is a schematic structural view of a collimator according to one embodiment of the present application.

As shown in FIGS. 2 and 3, the first opening 1171 and the second opening 1253 form a collimator to constrain the light entering the photosensitive element. An aperture of the second opening 1253 is a diameter D of the collimator, a height from the black matrix 1251 to the pixel definition layer 117 is a length L of the collimator, a height from a fingerprint 200 to the black matrix 1251 is H, assuming a peak-to-valley distance of the fingerprint 200 is Z, and an angle between the valley and peak to the collimator is θ, then the following formula applies:

$$\frac{L/2}{\frac{L}{2}+H}=\frac{D/2}{Z/2} \qquad \text{Formula (1)}$$

From Formula 1, it can be deduced:

$$\tan\frac{\theta}{2}=\frac{Z/2}{\frac{L}{2}+H}=\frac{D}{L}. \qquad \text{Formula (2)}$$

It is known that when the angle θ between the valley and peak to the collimator is fixed (a smaller θ indicates higher optical recognition accuracy), the diameter D of the collimator is directly proportional to the length L of the collimator, and the diameter D of the collimator is positively correlated with the area of the photosensitive element. Therefore, increasing the diameter D of the collimator can enhance the sensitivity of the photosensitive element. In related technologies, a maximum length L of the collimator is 21 microns. If the angle θ of the collimator is set to 5°, then according to Formula (2), the diameter D of the collimator can be calculated to be 5.3 microns. However, in current technology, the opening limit of the black matrix 1251 is 7 microns, which means the existing process limits are insufficient to meet the requirements for high sensitivity, making it difficult in related technologies to ensure recognition sensitivity while maintaining optical recognition accuracy.

In this embodiment, by setting the second organic layer 120 in the encapsulation layer and arranging the first organic layer 123 on the touch layer, the length of the collimator can be modulated by both the first organic layer 123 and the second organic layer 120. Based on current ink printing technology, the thicknesses of the first organic layer 123 and the second organic layer 120 can be 18 microns, so the length L of the collimator in this application can be 36 microns. For instance, when the combined thickness of the first organic layer 123 and the second organic layer 120 is 36 microns and the collimator angle is approximately θ≈5°, according to Formula 2, the diameter D of the collimator in this application can be as large as 9 mm, far exceeding the 5.3 microns in related technologies. Therefore, under the same optical recognition accuracy, the area of the photosensitive element in this application is larger than the area of the photosensitive element in related technologies, thereby achieving higher sensitivity.

In this embodiment, by arranging the first organic layer 123 on the touch layer and placing the second organic layer 120 in the encapsulation layer, and modulating the length L of the collimator through both the first organic layer 123 and the second organic layer 120, the range of values for the length L of the collimator is increased. Thus, under the same optical recognition accuracy, the range of values for the diameter D of the collimator is increased, subsequently enlarging the area of the photosensitive element, enhancing the sensitivity of fingerprint recognition, and addressing the issue of small collimation hole apertures leading to small fingerprint sensor areas and lower sensitivity in related technologies.

In one embodiment, a third opening 1272 is set between at least two adjacent touch signal lines 1271. The third opening 1272 overlaps with the first opening 1171 and the second opening 1253 in the thickness direction of the photosensitive layer. The touch electrodes include a black metal material. It is understood that the third opening 1272, located between the first opening 1171 and the second opening 1253, further increases the confinement of incident light.

It can be understood that since the length L of the collimator in this application is much larger than that in related technologies, the application can increase the aperture of the first opening 1171 and/or the second opening 1253 to reduce the difficulty associated with the corresponding opening process. In some embodiments, the aperture of the first opening 1171 is larger than the aperture of the second opening 1253. In other embodiments, the aperture of the second opening 1253 is larger than the aperture of the first opening 1171. In some embodiments, the apertures of the first opening 1171, the second opening 1253, and the third opening 1272 are the same.

In one embodiment, orthographic projections of the touch signal line 1271 and the touch sensor are within a boundary of an orthographic projection of the black matrix 1251, meaning the touch signal line 1271 and the touch sensor are covered by the black matrix 1251 and do not affect the user experience.

As shown in FIG. 2, in one embodiment, the first planarization layer includes a planarization portion 122 and a first barrier 128. The planarization portion 122 is situated between the touch layer and the first organic layer 123, with part of the planarization portion 122 filling the third opening 1272. The first barrier 128 is located on the first inorganic layer 118 and is on the outside of the first organic layer 123. It is understood that since the first organic layer 123 is prone to flowing during the processing, the first barrier 128 is established to prevent the first organic layer 123 from spilling over during production. The first barrier 128 can be arranged to surround the first organic layer 123 or other blocking methods can be chosen as required.

In one embodiment, the second barrier 119 can be formed during a PDL/PS process flow. An orthographic projection of the second barrier 119 projected on the first collimation layer is located outside an orthographic projection of the first barrier 128 projected on the first collimation layer. This arrangement allows the first organic layer 123 to be constrained on both sides by the first barrier 128 and the second barrier 119.

In some embodiments, part of the first inorganic layer 118 and part of the second organic layer 120 fill the first opening 1171, part of a second planarization layer 124 fills the second opening 1253, and part of the planarization portion 122 fills the third opening 1272.

In one embodiment, the display panel also includes the second planarization layer 124 and a cover plate 126. The second planarization layer 124 is located on the first organic layer 123 and the color filter layer. The cover plate 126 is disposed on the second planarization layer 124. By setting the second planarization layer 124, the film layer structure in the aforementioned process can be flattened, allowing for a smoother fit of the cover plate 126.

In some embodiments, a halide metal layer may be included between the cathode and the first inorganic layer 118. The halide metal layer includes, for example, LiF. The halide metal layer can prevent damage to the cathode when the first inorganic layer 118 is formed by sputtering or plasma deposition methods.

In a second aspect, the present application also provides a display device that includes any of the display panels described in the aforementioned embodiments.

It can be understood that for those skilled in the art, equivalent replacements or modifications can be made based on the technical solutions and inventive concepts of this application, and all such changes or replacements should fall within the protection scope of the appended claims of this application.

What is claimed is:

1. A display panel, comprising:

a photosensitive layer comprising a photosensitive element;

a first collimation layer disposed on the photosensitive element and comprising a first opening;

an encapsulation layer disposed on the first collimation layer; and a second collimation layer disposed on the encapsulation layer and comprising a second opening, wherein the first opening, the second opening, and the photosensitive element overlap each other in a thickness direction of the photosensitive layer, wherein the display panel further comprises a first organic layer disposed between the encapsulation layer and the second collimation layer; the encapsulation layer further comprises a second organic layer; the first organic layer and the second organic layer overlap with the first opening, the second opening, the photosensitive element in the thickness direction of the photosensitive layer;

wherein the first collimation layer is a pixel definition layer, the second collimation layer is a color filter layer, the color filter layer comprises a plurality of color filters and a black matrix, the black matrix comprises a plurality of color filter openings and multiple second openings, and the color filters are disposed in the color filter openings;

wherein the first opening and the second opening form a collimator configured to collimate light entering the photosensitive element; an aperture of the second opening is a diameter of the collimator, and a height from a top surface of the black matrix to a bottom surface of the pixel definition layer is a length of the collimator; and a first barrier is located on the pixel definition layer and arranged outside the first organic layer.

2. The display panel according to claim 1, wherein the pixel definition layer is provided with a plurality of pixel openings and multiple first openings, a light-emitting device is disposed in each of the pixel openings, and the pixel definition layer comprises a black organic material.

3. The display panel according to claim 1, wherein an aperture of the first opening is larger than an aperture of the second opening.

4. The display panel according to claim 1, wherein an aperture of the first opening is smaller than an aperture of the second opening.

5. The display panel according to claim 1, further comprising a touch layer disposed between the encapsulation layer and the first organic layer, wherein the touch layer comprises a plurality of touch signal lines, a third opening is defined between at least two adjacent touch signal lines, and the third opening overlaps with the first opening and the second opening in the thickness direction of the photosensitive layer.

6. The display panel according to claim 5, further comprising a first planarization layer, the first planarization layer comprising a planarization portion and the first barrier;

wherein the planarization portion is disposed between the touch layer and the first organic layer.

7. The display panel according to claim 6, wherein a portion of the planarization portion is filled in the third opening.

8. The display panel according to claim 6, wherein the encapsulation layer comprises a first inorganic layer and a second inorganic layer, and the first inorganic layer, the second organic layer and the second inorganic layer overlap each other in the thickness direction of the photosensitive layer, wherein the display panel further comprises a plurality of second barriers, the second barriers are disposed on the first inorganic layer, the second barriers are disposed outside the second organic layer, an orthographic projection of each of the second barriers projected on the pixel definition layer is located outside an orthographic projection of the first barrier projected on the first collimation layer.

9. A display device, comprising a display panel, wherein the display panel comprises:

a photosensitive layer comprising a photosensitive element;

a first collimation layer disposed on the photosensitive element and comprising a first opening;

an encapsulation layer disposed on the first collimation layer; and a second collimation layer disposed on the encapsulation layer and comprising a second opening, wherein the first opening, the second opening, and the photosensitive element overlap each other in a thickness direction of the photosensitive layer, wherein the display panel further comprises a first organic layer disposed between the encapsulation layer and the second collimation layer; the encapsulation layer further comprises a second organic layer; the first organic layer and the second organic layer overlap with the first opening, the second opening, the photosensitive element in the thickness direction of the photosensitive layer;

wherein the first collimation layer is a pixel definition layer, the second collimation layer is a color filter layer, the color filter layer comprises a plurality of color filters and a black matrix, the black matrix comprises a plurality of color filter openings and multiple second openings, and the color filters are disposed in the color filter openings;

wherein the first opening and the second opening form a collimator configured to collimate light entering the photosensitive element; an aperture of the second opening is a diameter of the collimator, and a height from a top surface of the black matrix to a bottom surface of the pixel definition layer is a length of the collimator; and a first barrier is located on the pixel definition layer and arranged outside the first organic layer.

10. The display device according to claim 9, wherein the pixel definition layer is provided with a plurality of pixel openings and multiple first openings, a light-emitting device is disposed in each of the pixel openings, and the pixel definition layer comprises a black organic material.

11. The display device according to claim 9, wherein an aperture of the first opening is larger than an aperture of the second opening.

12. The display device according to claim 9, wherein an aperture of the first opening is smaller than an aperture of the second opening.

13. The display device according to claim 9, wherein the display panel further comprises a touch layer disposed between the encapsulation layer and the first organic layer, wherein the touch layer comprises a plurality of touch signal lines, a third opening is defined between at least two adjacent touch signal lines, and the third opening overlaps with the first opening and the second opening in the thickness direction of the photosensitive layer.

14. The display device according to claim 13, wherein the display panel further comprises a first planarization layer, the first planarization layer comprising a planarization portion and the first barrier;

wherein the planarization portion is disposed between the touch layer and the first organic layer.

15. The display device according to claim 14, wherein a portion of the planarization portion is filled in the third opening.

16. The display device according to claim 14, wherein the encapsulation layer comprises a first inorganic layer and a second inorganic layer, and the first inorganic layer, the second organic layer and the second inorganic layer overlap each other in the thickness direction of the photosensitive layer, wherein the display panel further comprises a plurality of second barriers, the second barriers are disposed on the first inorganic layer, the second barriers are disposed outside the second organic layer, an orthographic projection of each of the second barriers projected on the pixel definition layer is located outside an orthographic projection of the first barrier projected on the first collimation layer.

* * * * *